United States Patent [19]

Kanda et al.

[11] Patent Number: 5,344,739
[45] Date of Patent: Sep. 6, 1994

[54] PHOTOSENSITIVE DIAZO RESIN COMPOSITION FOR LITHOGRAPHIC PRINTING UTILIZING A XANTHENE DYE HAVING AN ANION GROUP AS THE COUNTER ION OF THE DIAZONIUM GROUP

[75] Inventors: Kazunori Kanda, Yao; Osamu Nanba, Takarazuka; Edward Lam, Hirakata, all of Japan

[73] Assignee: Nippon Paint Co., Ltd., Osaka, Japan

[21] Appl. No.: 969,962

[22] Filed: Nov. 2, 1992

[30] Foreign Application Priority Data

Nov. 1, 1992 [JP] Japan ................................ 3-287493

[51] Int. Cl.$^5$ .............................................. G03F 7/021
[52] U.S. Cl. ................................... 430/175; 430/163; 430/176; 430/302
[58] Field of Search ................ 430/175, 176, 163, 302

[56] References Cited

U.S. PATENT DOCUMENTS

| | | | |
|---|---|---|---|
| 3,778,274 | 12/1973 | Inoue et al. | 430/175 |
| 4,486,529 | 12/1984 | Jeffers et al. | 430/175 |
| 4,912,013 | 3/1990 | Suzuki et al. | 430/175 |

*Primary Examiner*—Charles L. Bowers, Jr.
*Assistant Examiner*—Christopher G. Young
*Attorney, Agent, or Firm*—Wenderoth, Lind & Ponack

[57] ABSTRACT

A photosensitive diazo resin-containing photosensitive resin composition for lithographic printing comprising a sensitizing dye having an anion group in a molecule as a counter ion of a diazonium group.

5 Claims, No Drawings

PHOTOSENSITIVE DIAZO RESIN COMPOSITION FOR LITHOGRAPHIC PRINTING UTILIZING A XANTHENE DYE HAVING AN ANION GROUP AS THE COUNTER ION OF THE DIAZONIUM GROUP

FIELD OF THE INVENTION

The present invention relates to a photosensitive resin composition for lithographic printing. More particularly, it relates to a photosensitive diazo resin composition for a negative type printing material.

BACKGROUND OF THE INVENTION

In general, a photosensitive plate for lithographic printing consists of a photosensitive layer comprising a photosensitive compound and a solvent-soluble binder resin as main component which is coated onto a substrate such as an aluminum plate. Such printing plate is then exposed through a photoimage (e.g. negative, etc.), and the nonexposed area of the photosensitive layer is removed by eluting with a developer and the exposed insolubilized area remains as the image area of the lithographic printing plate.

Photosensitive plates for lithographic printing have been widely used in offset printing, because the time taken for the plate-making process is short, and the operation is relatively simple. Accordingly, it is possible to provide a printing plate having excellent resolution, storage stability, developability and durability, and the demand for such a cheap photosensitive plate or resin composition used in lithographic printing is extremely large.

The following properties are required for a photosensitive resin having excellent properties which is used for making a photosensitive plate or photosensitive resin composition for lithographic printing:

(1) high sensitivity, that is, high absorptivity to active energy such that an image can be formed even when the exposure amount is small;

(2) stability, that is, the reactions (e.g. decomposition, crosslinking, etc.) will remain unchanged (even when it is stored for a long period of time at room temperature or under the conditions of high temperature and high humidity); and (3) solvent-solubility, that is, it has excellent solubility to a developer containing no harmful solvent (e.g. DMF, methyl cellosolve, etc.).

Diazo resin has widely been used as a photosensitive compound for lithographic printing plate because it satisfies the above properties, comparatively. Diazo resin is a resin containing a diazonium salt. At present, a diazo resin is obtained by polycondensation of p-diazodiphenyl amine and paraformaldehyde with an inorganic or organic counter anion and is mainly used as photosensitive resin for lithographic photosensitive plate.

In order to further improve printing properties, particularly sensitivity, stability and solvent-solubility of the diazo resin, various trials have been made heretofore.

As a trial for high sensitization of the diazo resin, for example, a diazonium compound of which the main chain is polyester is described in Japanese Patent Kokai No. 54-30121. However, it is necessary to use a toxic compound (e.g. trifluoroacetic acid, etc.) as solvent in order to prepare a diazo resin from a diazonium compound, and a reaction process at high temperature for a long period of time is also necessary. Accordingly, such a method is not suitable for practical use.

In Japanese Patent Kokai No. 58-062641, a method comprising synthesizing a prepolymer from acetylamino aniline and then diazotizing the prepolymer to prepare a diazo resin is described. Further, in Japanese Patent Kokai No. 58-187925, synthesis of a diazo resin according to the reaction of a diazonium compound with a vinyl ester compound is described. However, these methods are complicated because there are many synthesis processes, which are not suitable for practical use. Further, such diazo resin is inferior in solvent-solubility and, therefore, the resulting photosensitive plate is inferior in developability.

In Japanese Patent Kokai No. 61-273538, there is described a diazo resin obtained by esterifying a diazonium compound having a hydroxyl group to bond with a carboxylic acid-containing compound, followed by esterification with styrene-anhydrous maleic acid copolymer at room temperature for 3 hours. However, since sensitivity is not sufficiently improved, the resulting photosensitive plate is inferior in resolution.

These conventional diazo resins normally exhibit high sensitivity to a light having a wavelength of about 220 to 400 nm, but their sensitivity to visible light having wavelengths of not less than 400 nm is insufficient. Accordingly, when the visible light is used for exposure, only part of the irradiation light is absorbed and, therefore, insufficient sensitivity can be obtained.

In order to improve the stability of the diazo resin, a trial for improving the water-insolubility and lipophilic nature of the diazo resin has been made by coupling a water-soluble diazo resin with an inorganic compound. In Japanese Patent Kokai No. 47-1167, coupling of a water-soluble diazo resin with an acidic aromatic compound or coupling of a water-soluble diazo resin with a phenolic aromatic compound containing a hydroxyl group is described. However, since resins obtained by these methods are inferior in solubility to glycol, ether, alcohol and ketone, developability of a photosensitive plate becomes inferior. Further, a sulfonic acid or sulfonate containing a long chain alkyl group used therein is deposited in the gum-like form on synthesis and, therefore, it is hardly produced.

Further, a trial for using a non-aqueous and organic solvent-soluble counter anion has also been made. In Japanese Patent Kokai No. 54-98613, halogenated Lewis acid (e.g. $BF_4$, $PF_6$, etc.) is used. In Japanese Patent Kokai No. 56-121031, perhalogen acid, perchloric acid and periodic acid are used. However, resins obtained by these methods are inferior in solvent-solubility. Accordingly, the developability of such photosensitive plate becomes inferior and the diazo resin remains on the non-image area even after development and, therefore, scumming arises during printing.

In Japanese Patent Kokai No. 59-38746, a trial for using an organic coupling agent in combination with an inorganic coupling agent is described. However, a resin obtained by such method is remarkably inferior in solubility to an alkaline developer. Accordingly, developability of a photosensitive plate becomes inferior and the diazo resin remains on the non-image area even after development and, therefore, scumming arises during printing.

In Japanese Patent Kokai No. 62-175731, a combination of two sorts of an organic sulfonic acid having not less than 2.5 basic units is described. In Japanese Patent Kokai No. 60-97350, the use of sulfopolyester as counter anion is described. According to these methods, stability of the resulting diazo resins is improved, however, reactivity of the diazo resin is lowered, which results in substantially insufficient resolution.

As a conventional trial for improving solvent-solubility of the diazo resin, for example, a co-condensation of an aromatic compound containing a phenolic hydroxyl group with an aromatic diazonium compound is described in Japanese Patent Kokai No. 1-102456. In Japanese Patent Kokai No. 1-102457, a co-condensation of an aromatic compound containing at least one sort of a carboxyl group and a hydroxyl group with an aromatic diazonium compound is described. Further, in Japanese Patent Kokai No. 1-245246, a co-condensation of an aromatic compound containing a sulfonic group, sulfinic group, and phenylene and naphthylene containing a salt thereof with an aromatic diazonium is described. However, when these resin compositions are used, the durability of the resulting printing plate becomes inferior.

OBJECTS OF THE INVENTION

The main object of the present invention is to provide a photosensitive diazo resin-containing photosensitive resin composition for lithographic printing having excellent sensitivity, particularly excellent photosensitivity to irradiation light having wavelengths of 400 to 600 nm, and excellent stability, having a wide range of dissolution to solvents.

This object as well as other objects and advantages will become apparent to those skilled in the art from the following description.

SUMMARY OF THE INVENTION

That is, according to the present invention, there is provided a photosensitive diazo resin-containing photosensitive resin composition for lithographic printing comprising a sensitizing dye having an anion group in a molecule as a counter ion of a diazonium group.

DETAILED DESCRIPTION OF THE INVENTION

The photosensitive diazo resin which can be used in the present invention is that in which a sensitizing dye having an anion group is used as a counter ion of a diazonium group of a diazonium group-containing resin known to the art.

The aromatic diazonium compound is not specifically limited, but a phenyl or naphthalene derivative which optionally have an anion group, hydroxyl group, amino group and/or quaternary ammonium group is preferable. Examples thereof include 4-diazo-4'-methoxydiphenylamine hexafluorophosphate, 4-diazo-4'-methoxydiphenylamine hydrogensulfate, 4-diazo-4'-ethoxydiphenylamine hexafluorophosphate, 4-diazo-4'-propoxydiphenylamine tetrafluoroborate, 4-diazo-3-methoxydiphenylamine hexafluoroborate, 4-diazo-3-diphenylamine tetrafluoroborate, 4-diazo-diphenylamine hexafluorophosphate, 4-diazodiphenylamine hydrogensulfate and the like. Particularly preferred aromatic diazonium compounds are 4-diazo-4'-methoxydiphenylamine salt, 4-diazo-4'-ethoxydiphenylamine salt, 4-diazo-3-methoxydiphenylamine salt, a salt of 4-diazo-diphenylamine with hydrogensulfate and the like.

As the active carbonyl compound which can be used as the crosslinking agent for polycondensation reaction, for example, there are aldehydes (e.g. paraformaldehyde, formaldehyde, acetoaldehyde, butylaldehyde, benzaldehyde, etc.), ketones (e.g. acetone, acetophenone, etc.). Other crosslinking agents for polycondensation reaction include vinyl compounds, vinyl ester compounds, vinyl ether compounds and sulfur derivatives and compounds having the general formula:

$$E(-CHR_a-O-R_b)_m$$

[wherein E is a residue obtained by the splitting off of m H atoms from a compound B of the above-indicated meaning, $R_a$ is H, an aryl, alkyl or heterocyclic group, preferably hydrogen, $R_b$ is H, an alkyl or alkanoyl group with 1 to 4 carbon atoms, or a phenyl group, and is preferably hydrogen, methyl, ethyl or acetyl, and m is an integer from 1 to 10].

Examples of such compounds are bis-methoxymethyldiphenylene oxide, 4,4'-bis-methoxymethyl diphenylmethane, etc.

The reaction for preparing the diazo resin is well known in the art. For example, it may be conducted according to a method described in Photo. Sci. Eng., Vol. 17, pages 33 (1973), or a method described in British Patent No. 1312725.

In that case, an aromatic diazonium compound and an active carbonyl compound are subjected to a polycondensation reaction in sulfuric acid, phosphoric acid, hydrochloric acid or methanesulfonic acid at 5° to 70° C. for 30 minutes to 72 hours under a normal pressure to obtain a diazo resin.

The molecular weight of the resulting diazo resin changes depending upon the ratio of the molar number of the aromatic diazonium compound to that of the active carbonyl compound to be added, a reaction temperature and a reaction time. Normally, the ratio of the aromatic diazonium compound to the active carbonyl compound is 0.6 to 1.5/1, preferably 0.7 to 1.4/1. A weight-average molecular weight of the diazo resin thus obtained is 400 to 50,000, preferably 600 to 20,000, more preferably 800 to 5,500.

The sensitizing dye used in the photosensitive resin composition of the present invention is a dye having at least one anion group such as sulfonic group, carboxyl group and phosphoric group or a salt thereof in a molecule. The sensitizing dye may have a cation in a molecule. It is preferred that the sensitizing dye is an acidic dye. A basic dye does not react with a diazo group to form a salt by exchange and, therefore, it is not preferable.

Examples of the dye or sensitizing dye which can be used in the photosensitive resin composition of the present invention include C.I. Acid Yellow 1, 7, 11, 23, 25, 29, 36, 38, 40, 42, 44, 49, 59, 61, 70, 72, 75, 76, 78, 79, 98, 99, 110, 111, 112, 114, 116, 118, 119, 127, 128, 131, 141, 142, 161,162, 163,164 and 165; C.I. Acid Green 3, 7, 9, 12, 16, 19, 20, 25, 27, 28, 35, 36, 40, 41, 43, 44, 56, 57, 60, 61, 65, 73, 75, 76, 78 and 79; C.I. Direct Blue 86 and 123; C.I. Acid Blue 1, 7, 9, 15, 22, 23, 25, 27, 29, 40, 41, 43, 45, 54, 59, 60, 62, 72, 74, 78, 80, 82, 83, 90, 92, 93, 100, 102, 103, 104, 112, 113, 117, 120, 126, 127, 129, 130, 131, 138, 140, 142, 143, 151, 154, 158, 161, 166, 167, 168, 170, 171, 175, 182, 183, 184, 187, 192, 199, 203, 204, 205, 229, and 236; C.I. Acid Orange 1, 7, 8, 10, 19, 20, 24, 28, 33, 41, 43, 45, 51, 56, 63, 64, 65, 67, 74, 80, 82, 85, 86, 87, 88, 95, 122, 123 and 124; C.I. Direct Orange; C.I. Acid Red 1, 6, 8, 9, 13, 14, 18, 26, 27, 32, 35, 37, 42, 51, 52, 57, 75, 77, 80, 82, 83, 85, 87, 88, 89, 92, 94, 97, 106, 111, 114, 115, 117, 118, 119, 129, 130, 131, 133, 134, 138, 143, 145, 154, 155, 158, 168, 180, 183, 184, 186, 194, 198, 199, 209, 211, 215, 216, 217, 219, 249, 252, 254, 256, 257, 262, 265, 274, 276, 282, 283, 303, 317, 318, 320, 321 and 322; C.I. Acid Violet 7, 11, 15, 31, 34, 35, 41, 43, 47, 48, 49, 51, 54, 66, 68, 75, 78, 97 and 106; C.I. Direct Violet 63; C.I. Acid Brown 2, 4, 13, 14, 19, 20, 27, 28, 30, 31, 39, 44, 45, 46, 48, 53, 92, 100, 101, 103, 104, 106, 160, 161, 165, 188, 224, 225, 226, 231, 232, 236, 247, 256, 257, 266, 268, 276, 277, 282, 281, 294, 295, 296, 297, 299, 300, 301 and 302; C.I. Acid Black 1, 2, 7, 24, 26, 29, 31, 44, 48, 50, 51, 52, 58, 60, 62, 63, 64, 67, 72, 76, 77, 94, 107, 108, 109, 110, 112, 115, 118, 119, 121, 122, 131, 132, 139, 140, 155, 156, 157, 158, 159 and 191.

As a dye having a strong sensitizing property which can be used in the present invention, for example, there are amidinium dyes (e.g. cyanine dye, hemicyanine dye, styryl dye, etc.), carboxyl ion dyes (e.g. xanthene dye, oxonol dye, etc.), dipole amide dye (e.g. merocyanine dye, etc.) and the like.

Representative examples of the dye having strong sensitizing property include Erythrosine, Eosine Y, Rose Bengal, Fluorescein, Uranine, Sulpho Rhodamine, Solubilized Vat Blue 1, Solubilized Vat Blue 5, Solubilized Vat Blue 41, Solubilized Vat Black 1, Solubilized Vat Red 1, Acid Red 87, Acid Red 88, Acid Blue 1, Acid Blue 74, Acid Yellow 73, Food Blue 1, Direct Blue 11 and the like.

Examples of particularly preferable sensitizing dye include Erythrosine, Eosine Y, Rose Bengal, Fluorescein, Uranine and Sulfo Rhodamine.

The exchange reaction can be conducted with the counter anion by adding these dyes to the diazo resin prepared as described above. As a result, the diazo resin containing the sensitizing dye as the counter anion of the diazonium group of the present invention is deposited. The amount of the dye varies depending upon the kind of dye to be used and the number of equivalents of the diazo group of the diazo resin. Generally, the molar ratio of the diazo group of the diazo resin to the anion group of the sensitizing dye is 100/2 to 120, preferably 100/20 to 100.

For the diazo resin of the present invention, various compounds are used in combination with the above sensitizing dyes as the counter anion. Examples of the compound which can be used as the counter anion include organic acids or salt thereof, inorganic acids and the like.

Examples of the organic acid or salt thereof which can be used as the counter anion include an organic acid or salt thereof containing a skelton described in the following item (i) or an acid group described in the following item (ii):

(i) aromatic skeltons (e.g. benzene, toluene, naphthalene, etc.) and aliphatic skeltons (e.g. polymer described in Japanese Patent No. 5700542, sulfonated polymer, etc.);

(ii) acid groups (e.g. carboxylic acid, decanoic acid, phosphonic acid, phosphinic acid, phenylphosphoric acid, sulfonic acid, etc.).

Examples thereof include paratoluenesulfonic acid, mesitylenesulfonic acid, naphthalenesulfonic acid, dodecylbenzenesulfonic acid and a sodium and potassium salt thereof.

As the inorganic acid used as the counter anion, for example, there are halogenated Lewis acid (e.g. $PF_6$, $BF_4$, etc.), perhalogen acid (e.g. $ClO_4$, $IO_4$, etc.) and the like.

Further, a hydroxyl group-containing aromatic compound (e.g. phenolic acid, etc.) and a polymer containing a carboxyl group or an anhydride group may also be used as the counter anion.

Examples of the preferred counter anion include p-toluenesulfonic acid, mesitylenesulfonic acid, dodecylbenzenesulfonic acid, 2-methoxy-4-hydroxybenzophenone-5-sulfonic acid, $PF_6$, $BF_4$, $Sb_6$ and the like.

When a counter anion other than the anion group-containing dye is used in combination, the anion group-containing dye may be firstly added to the diazo resin followed by the addition of the other counter anion to conduct the anion change, or both anion compounds may be added to the diazo resin to conduct the anion exchange. It is preferable that the molar ratio of the anion group-containing dye to that of the other counter anion is 100 to 2/0 to 98.

The diazo resin of the present invention per se can be polymerized by subjecting it to a polymerization reaction upon irradiation, which results in formation of an image. However, from a viewpoint of cost, physical properties of film, workability, etc., it is preferred to use the diazo resin as a photosensitive resin composition in combination with a binder resin having excellent solvent-developability, which forms a matrix of a printing plate. For example, by using the diazo resin of the present invention in combination with a water-soluble resin (e.g. PVA, etc.), a water-developable photosensitive composition is prepared.

As the binder resin used in the photosensitive resin composition, for example, there are acrylic resin, polyester resin, alkyd resin, phenol resin, epoxy resin, polyvinyl resin, polyurethane resin, polyether resin, polyamide resin and a modified resin thereof. The resin having a dissolution and dispersion property to water or alkali solution is preferred, and an alkali solution-soluble acrylic resin and phenol resin are particularly preferred. At least two sorts of binder resins may be used in combination.

As the preferred alkali solution-soluble acrylic resin, for example, there is an acrylic resin having an acid value of 10 to 150, a hydroxyl group value of 1 to 250 and a molecular weight of 2,000 to 500,000, more preferably an acrylic resin having an acid value of 10 to 40, a hydroxyl group value of 40 to 200 and a molecular weight of 5,000 to 40,000. The resin per se may have photosensitivity.

The acrylic resin is an acrylic polymer which is normally used in the paint industry. Further, the acrylic resin is obtained by polymerizing an ester monomer of acrylic acid or methacrylic acid alone, or copolymerizing the ester monomer with the another ethylenically unsaturated monomer. Such a polymerization operation is conducted by a method well known in the art. In Japanese Patent Application No. 3-20919, there are described a polymerization initiator, a solvent and reaction conditions which can be used for polymerization.

Monomers which can be used for preparing a preferred acrylic resin are as follows:

(I) acidic group-containing monomers (e.g. acrylic acid, methacrylic acid, crotonic acid, itaconic acid, maleic acid, anhydrous maleic acid, fumaric acid, sodium vinylsulfonate, styrene-p-sodium sulfonate, 2-acrylamide-2-methylpropanesulfonic acid, 2-amide-phosphoxyethyl methacrylate, etc.);

(II) hydroxyl group-containing monomers (e.g. 2-hydroxyethyl acrylate, hydroxypropyl acrylate, 2-hydroxyethyl methacrylate, hydroxypropyl methacrylate, hydroxybutyl acrylate, hydroxybutyl methacrylate, allyl alcohol, metaallyl alcohol, N-(4-hydroxyphenyl)acrylamide or N-(4-hydroxyphenyl)methacrylamide, o-, m- or p-hydroxystyrene, o-, m- or p-hydroxyphenyl acrylate or methacrylate, etc.;

(III) alkyl acrylates or methacrylates (e.g. methyl (meth)acrylate, ethyl (meth)acrylate, n-butyl (meth)acrylate, propyl (meth)acrylate, acyl (meth)acrylate, cyclohexyl (meth)acrylate, octyl acrylate, 2-chloroethyl acrylate, etc.;

(IV) polymerizable amides such as acrylamides or methacrylamides (e.g. acrylamide, methacrylamide, N-methylolacrylamide, N-methylolmethacrylamide, N-ethylacrylamide, N-hexylacrylamide, N-cyclohexylacrylamide, N-hydroxyethylacrylamide, N-phenylacrylamide, N-nitrophenylacrylamide, N-ethyl-N-phenylacrylamide, etc.);

(V) nitrogen-containing alkyl acrylates or methacrylates (e.g. dimethylaminoethyl acrylate, dimethylaminoethyl methacrylate, etc.);

(VI) vinyl ethers (e.g. ethyl vinyl ether, 2-chloroethyl vinyl ether, hydroxyethyl vinyl ether, propyl vinyl ether, butyl vinyl ether, octyl vinyl ether, phenyl vinyl ether, etc.;

(VII) vinyl esters (e.g. vinyl acetate, vinyl chloroacetate, vinyl butyrate, vinyl benzoate, etc.);

(VIII) styrenes (e.g. styrene, α-styrene, methylstyrene, chloromethylstyrene, etc.);

(XI) vinyl ketones (e.g. methyl vinyl ketone, ethyl vinyl ketone, propyl vinyl ketone, phenyl vinyl ketone, etc.);

(X) olefins (e.g. ethylene, propylene, isobutylene, butadiene, isoprene, etc.);

(XI) glycidyl (meth)acrylates;

(XII) polymerizable nitriles (e.g. acrylonitrile, methacrylonitrile, etc.);

(XIII) N-vinylpyrrolidone, N-vinylcarbazole, 4-vinylpyridine;

(XIV) ampho-ionic monomers (N,N-dimethyl-N-methacryloxyethyl-N-(3-sulfopropyl)-ammonium-betain, N,N-dimethyl-N-methacrylamidepropyl-N-(3-sulfopropyl)-ammonium betain, 1-(3-sulfopropyl)-2-vinylpyridinium-betain, etc.; and (XV) compounds obtained by reacting the above monomers with compounds having a functional group which is chemically reactive with the monomers (e.g. reaction produced monomer of a hydroxyl group-containing monomer (II) with an isocyanate compound, reaction produced monomer of a carboxyl group-containing monomer (I) with a glycidyl group-containing compound, etc.).

In the present invention, examples of the other preferred binder resin which is formulated together with the diazo resin include an alkali-soluble novolak resin. Examples thereof include phenol-formaldehyde resin, cresol-formaldehyde resin, p-t-butyl phenol-formaldehyde resin, phenol-modified xylene resin, phenol-modified xylene mesitylene resin and the like. Examples of the other useful alkali-soluble resin include copolymers of polyhydroxystyrene, polyhalogenated hydroxystyrene and (meth)acrylic acid with the other vinyl compounds (e.g. methyl methacrylate, etc.). Further, if necessary, polyvinyl butyral resin, polyurethane resin, polyamide resin, polystyrene-maleic acid resin, epoxy resin, natural resin and modified resin or water-solubilized modified resin thereof may be used.

The photosensitive composition of the present invention is prepared by formulating a diazo resin in an amount of 5 to 30 parts by weight, preferably 6 to 20 parts by weight based on 100 parts by weight of the binder resin. When the amount of the diazo resin is smaller than 5 parts by weight, resolution of the resulting photosensitive plate and durability of the printing plate are lowered. When the amount of the diazo resin exceeds 30 parts by weight, sensitivity of the photosensitive composition and developability of the photosensitive plate are lowered.

The photosensitive resin composition of the present invention further contains image colorants such as dyes, pigments and the like. The image colorant is formulated so as to improve image distinguishability and handling characteristic of the printing plate, and a basic dye and an oil-soluble dye are preferred. Examples thereof include basic dyes such as Victoria Pure Blue BOH, Victoria Blue BH, Methyl Violet, Aizen Malachite Green (hereinabove, manufactured by Hodagaya Chemical K.K.), Patent Pure Blue VX, Rhodamine B, Methylene Blue (hereinabove, manufactured by Sumitomo Chemical Industries K.K.), etc. and oil-soluble dyes such as Sudan Blue II, Victoria Blue F4R (hereinabove, manufactured by B.A.S.F.), Oil Blue #603, Oil Blue BOS, Oil Blue IIN (hereinabove, manufactured by Orient Chemical Industries K.K.), etc.

The colarant is contained in the photosensitive composition of the present invention in an amount of 0.1 to 5 parts by weight, preferably 0.2 to 4 parts by weight based on 100 parts by weight of the binder resin. When the amount of the colorant is smaller than 0.1 parts by weight, visibility of the image area is not obtained. When the amount of the colorant exceeds 5 parts by weight, sensitivity of the photosensitive composition of the present invention is lowered and, therefore, resolution of the resulting photosensitive plate is lowered.

The photosensitive resin composition of the present invention may further contain additives, if necessary, such as solvents, fillers, pigments, photo-degradable acid generators, surfactants for improving application property, anti-foaming agents and organic or inorganic fillers. As the organic filler, for example, microgel (particle size of 0.01 to 5 μm) of which the inside is gelatinized is preferred, and examples thereof are disclosed in Japanese Patent Application No. 3-36029.

By using the photosensitive resin composition of the present invention, a photosensitive plate for lithographic printing is made by a normal method. For example, the photosensitive resin composition of the present invention may be coated on a suitable substrate. Examples of the substrate include paper, paper on which a plastic (e.g. polyethylene, polypropylene, polystyrene, etc.) is laminated, aluminum (containing aluminum alloy), plate of metals (e.g. zinc, copper, etc.), plastic film (e.g. cellulose diacetate, cellulose triacetate, cellulose propionate, cellulose acetate, cellulose methyl acetate, cellulose ethyl acetate, cellulose nitrate, polyethylene terephthalate, polyethylene, polystyrene, polypropylene, polycarbonate, polyvinyl acetal, etc.), paper or plastic film on which the above metal is laminated or deposited and the like. Among these substrates, an aluminum plate has excellent dimensional stability and is comparatively lightweight and inexpensive, and it is preferred. A composite sheet wherein an aluminum sheet is bound to a polyethylene terephthalate film as described in Japanese Patent Kokoku No. 48-18327 is also preferred.

It is preferred that the substrate having the surface of metal, particularly aluminum is subjected to a hydrophilization treatment.

The method of coating is not specifically limited, for example, coating is conducted using a bar coater, followed by drying at 40° to 80° C. for 1 to 10 minutes. The amount of coating after drying is about 0.5 to 2.5 g/m². If necessary, the resin which is soluble in an alkali developer (e.g. polyvinyl alcohol, hydroxylpropyl methylcellulose, etc.) can be further coated, followed by drying to provide an overcoat layer.

The dried coat thus obtained is covered with a negative or positive film, exposed to light and then developed according to a normal method to obtain a lithographic printing plate. As the light source used for exposure, for example, there are carbon-arc lamp, mercury vapour lamp, xenon lamp, metal halide lamp, tungsten light, ultraviolet rays, ultraviolet-laser rays, visible-laser rays and the like. It is preferred that developing is conducted using an alkali developer. As the alkalinizing agent formulated in the alkali developer, for example, there are inorganic alkalinizing agents (e.g. sodium silicate, potassium silicate, potassium hydroxide, sodium hydroxide, lithium hydroxide, sodium tertiary phosphate, sodium secondary phosphate, ammonium tertiary phosphate, ammonium secondary phosphate, sodium metasilicate, sodium bicarbonate, ammonia, etc.) and organic amine compounds (e.g. monomethylamine, dimethylamine, trimethylamine, monoethylamine, diethylamine, triethylamine, monoisopropylamine, n-butylamines, monoethanolamine, diethanolamine, triethanolamine, monoisopropanolamine, disopropanolamine, triisopropanolamine, ethyleneimine, ethylenediamine, pyridine, etc.) As the solvent for the alkalinizing agent, for example, there can be used water (particularly, deionized water) and the like. If necessary, benzyl alcohol, phenyl cellosolve, ethyl cellosolve and the like are further used. The concentration of the alkalinizing agent may be appropriately selected.

The dizao resin of the present invention has remarkably high sensitivity and crosslinkability with the binder resin formulated therewith. The mechanism related to such high reactivity of the present diazo resin is not known for certain, but it is considered that, when the sensitizing is present as the counter ion of the diazonium group, excitation effect is large in comparison with the case that the sensitizing dye is present alone because of three-dimensional effect and intramolecular transfer effect, whereby, resolution of the diazonium group is accelerated and sensitivity becomes high.

As described above, by incorporating a sensitizing dye having an anion group in a molecule as a counter anion of a diazonium group, a photosensitive diazo resin-containing photosensitive resin composition for lithographic printing having excellent sensitivity, particularly excellent photosensitivity to an irradiation light having wavelengths of about 400 to 600 nm, and excellent stability, and a wide range of dissolution to solvents, can be obtained. Thereby, it becomes possible to provide a printing plate having excellent resolution, storage stability, developability and durabilty, which can be exposed even with an irradiation light having wavelengths of not less than 400 nm at which a conventional printing plate is not sensitized.

The following Examples and Comparative Examples further illustrate the present invention in detail but are not to be construed to limit the scope thereof. In the Examples and Comparative Examples, all "parts" are by weight unless otherwise stated.

In Examples 1 to 6, preparation of a diazo resin will be explained.

EXAMPLE 1

4-Diazo-diphenylamine sulfate (29.3 parts, 0.1 moles) was dissolved in concentrated sulfuric acid (100 parts) under ice cooling. To the reaction solution, paraformaldehyde (3 parts, 0.1 moles) was slowly added and the reaction temperature was maintained at 10° C. or less.

After the reaction was conducted for 2 hours, the reaction mixture was poured into ethanol (1 liter) under ice cooling and the precipitate formed was filtered off. The precipitate was completely washed with ethanol and dissolved in deionized water (200 ml). By adding an aqueous solution containing zinc chloride (13.6 parts) to the resulting aqueous solution, precipitate was formed. The precipitate was filtered off, washed with ethanol and dried to obtain a diazo resin 1. The resulting diazo resin was dissolved again in deionized water (200 ml), and to the aqueous solution was added erythrosine (87.9 parts) to conduct the anion exchange reaction. The resulting precipitate was filtered off, washed with deionized water and dried at room temperature for 24 hours to obtain a diazo resin 2. The molecular weight of the diazo resin was measured by GPC. As a result, the weight-average molecular weight was 2300. The organic solvent-solubility of the diazo resin 1 was evaluated. As a result, it was completely dissolved in DMF, methyl cellosolve and methoxypropanol.

EXAMPLE 2

According to the same manner as that described in Example 1 except that 4-diazo-4'-methoxyphenylamine sulfate (32.5 parts, 0.1 moles) was used in place of 4-diazodiphenylamine sulfate, paraformaldehyde (2.7 parts, 0.09 moles) was used and eosine (72 parts) was used in place of erythrosine, a dizao resin 2 was obtained. The weight-average molecular weight of the diazo resin 2 was 2500. The organic solvent-solubility of the diazo resin 2 was evaluated. As a result, it was completely dissolved in DMF, methyl cellosolve and methoxypropanol.

EXAMPLE 3

According to the same manner as that described in Example 1 except that 4-diazo-diphenylamine sulfate (29.2 parts, 0.08 moles) was used, acetaldehyde (4.4 parts, 0.1 moles) was used in place of paraformaldehyde and Rose Bengal (70 parts) was used in place of erythrosine, a dizao resin 3 was obtained. The weight-average molecular weight of the diazo resin 3 was 3600. The organic solvent-solubility of the diazo resin 3 was evaluated. As a result, it was completely dissolved in DMF, methyl cellosolve and methoxypropanol.

EXAMPLE 4

According to the same manner as that described in Example 1 except that a mixture of 4-diazophenylamine (16.6 parts, 0.057 moles) and benzyltrimethylammonium chloride (8.1 parts, 0.043 moles) was used in place of 4-diazophenylamine sulfate and an aqueous solution containing erythrosine (8.8 parts) and sodium hexafluorophosphate (15.1 parts) was used in place of erythrosine, a dizao resin 4 was obtained. The weight-average molecular weight of the diazo resin 4 was 4500. The organic solvent-solubility of the diazo resin 4 was evaluated. As a result, it was completely dissolved in DMF, methyl cellosolve and methoxypropanol.

EXAMPLE 5

According to the same manner as that described in Example 1 except that a mixture of fluorescein (20 parts) and paratoluenesulfonic acid (15 parts) was used in place of erythrosine, a diazo resin 5 was obtained. The weight-average molecular weight of the diazo resin 5 was 2200. The organic solvent-solubility of the diazo resin 5 was evaluated. As a result, it was completely dissolved in DMF, methyl cellosolve and methoxypropanol.

EXAMPLE 6

According to the same manner as that described in Example 2 except that sulpho rhodamine (72 parts) was used in place of eosine, a dizao resin 6 was obtained. The weight-average molecular weight of the diazo resin 6 was 2900. The organic solvent-solubility of the diazo resin 6 was evaluated. As a result, it was completely dissolved in DMF, methyl cellosolve and methoxypropanol.

COMPARATIVE EXAMPLE 1

According to the same manner as that described in Example 1 except that an aqueous solution containing sodium hexafluorophosphate (16.8 parts) was used in place of erythrosine, a dizao resin 7 was obtained. The weight-average molecular weight of the diazo resin 7 was 2200. The organic solvent-solubility of the diazo resin 7 was evaluated. As a result, it showed good solubility to only DMF.

In Examples 7 to 12, preparation of a photosensitive plate and a printing plate using the dizo resin of the present invention will be explained.

EXAMPLE 7

By using the diazo resin prepared in Example 1, a photosensitive composition of a formulation shown in Table 1 was prepared.

TABLE 1

| (Formulation) | |
| --- | --- |
| Component | Amount (parts) |
| Alkali-soluble acrylic resin[1] | 9.2 |
| Diazo resin 1 prepared in Example 1 | 1.2 |
| Methoxypropanol | 40.00 |
| Dimethylformamide | 49.75 |

[1]Acrylic resin having a molecular weight of 25,000 prepared using 2-hydroxyethyl methacrylate (100 parts), acrylonitrile (40 parts), isobutyl methacrylate (50 parts) and methacrylic acid (10 parts)

The resulting photosensitive composition solution was charged in a container and allowed to stand for 3 days. As a result, no sedimentation and separation was observed and it showed excellent stability. Further, the photosensitive composition solution was coated on an aluminum plate which had been roughened and subjected to a hydrophilization treatment by a bar coater and then dried at 80° C. for 4 minutes to obtain a negative type photosensitive plate for lithographic printing having the coating weight of 2 g/m². The application property of the composition was excellent and the composition can be uniformly coated. No paint defect such as seediness, dewetting and the like was observed.

Then, the photosensitive wavelength region of the resulting photosensitive plate was measured.

Firstly, the photosensitive plate was exposed with a diffraction grating irradiation spectroscope (manufactured by Nippon Bunko K.K., type CRM-FA) for two minutes. Then, the exposed photosensitive plate was developed with a commercially available diluted solution (developer for negative plate/water=1:1). The curable wavelength region was determined from the residual state of the photosensitive resin composition. As a result, it was 219 to 591 nm. This showed that, regarding the photosensitive resin composition wherein the diazo resin 1 is used, the photosensitive wavelength region is extended toward the long wavelength side in an amount of not less than 100 nm in comparison with a conventional photosensitive resin composition.

Then, the sensitivity of the resulting photosensitive plate was evaluated. Firstly, a photosensitive plate was piled with a Step Tablet No.2 (21 steps) manufactured by Kodak Co. and exposed to a light (light intensity of 3.3 mM/cm²) having a wavelength of 490 nm which was passed through TOSHIBA KL-49 filter for 10 seconds, using a xenon lamp (150 W) manufactured by Ushio Denki K.K. as a light source. Thereafter, it was developed with a commercially available developer for negative type lithographic printing and the number of cured steps were measured. The sensitivity (490 nm) of the photosensitive plate was calculated from the relation between irradiation light and transmission of the Tablet. As a result, it was 16 mj/cm².

Then, a printing plate was prepared using the resulting photosensitive plate and resolution was evaluated.

Firstly, the photosensitive plate was exposed with a vacuum printer HVP-22H manufactured by Sakaguchi Seiwa Kogyo K.K. (3 kW idlefin metal halide lamp manufactured by Eye graphics K.K.) through the negative film at a distance of 1.2 m for 1 minute and 30 seconds. Then, the exposed plate was developed with a diluted solution (developer for negative plate of automatic process/water=1:1) at a developing rate of 80 cm/min and coated with a gumming solution to obtain a lithographic printing plate.

The non-developed part was not observed in the resulting printing plate. The number of steps was 5 to 13 and it showed excellent image reproductivity.

Thereafter, durability and printing properties of the printing plate were evaluated. For the surface of the printing plate taken out from an automatic developing device, a rubbing test (100 times) was conducted using an absorbing wadding impregnated with water. As a result, no abrasion wear of the printing area and exposure of the substrate part due to abrasion wear was observed in the printing plate of the present invention even after rubbing, and it showed sufficient image area resistance.

Then, the other printing plate was mounted on a small lithographic printer Hamadaster 700CDX (manufactured by Hamada Insatsuki Seisakusho K.K.) and a high quality paper was printed using a commercially available ink. As a result, 100,000 sheets of paper were satisfactorily printed without scumming the non-image area.

COMPARATIVE EXAMPLE 2

According to the same manner as that described in Example 7 except that the diazo resin 7 prepared in Comparative Example 1 was used in place of the diazo resin 1, a photosensitive plate was obtained. The photosensitive wavelength region and sensitivity of the resulting photosensitive plate were measured according to the same manner as that described in Example 7. As a result, they were 219 to 458 nm and 882 mj/cm$^2$, respectively.

COMPARATIVE EXAMPLE 3

According to the same manner as that described in Example 7 except that a mixture of the diazo resin 7 (0.32 parts) and erythrosine (0.87 parts) was used in place of the diazo resin 1, a photosensitive plate was obtained. The photosensitive region and sensitivity of the resulting photosensitive plate were measured according to the same manner as that described in Example 7. As a result, they were 219 to 511 nm and 230 mj/cm$^2$, respectively. Like this, large increase of the photosensitive region and sensitivity was not observed only by the addition of the sensitizing dye. Further, the resolution was evaluated according to the same manner as that described in Example 7. As a result, the non-developed area was not observed in the resulting printing plate and the number of steps was 3 to 11.

EXAMPLE 8

By using an alkali-soluble acrylic resin 2 having an acid value of 54.6, a hydroxyl group value of 199 and a molecular weight of 22,000 of a formulation shown in Table 2 and the diazo resin 2 obtained in Example 2, a photosensitive composition of a formulation shown in Table 3 was prepared.

TABLE 2
(Formulation)

| Components | Amount (parts) |
| --- | --- |
| 2-Hydroxypropyl methacrylate | 46 |
| Acrylonitrile | 15 |
| Isobutyl methacrylate | 28.9 |
| SPE[1] | 2.5 |
| Methacrylic acid | 7.6 |

[1]N,N-dimethyl-N-methacrylamidepropyl-N-(3-sulfopropyl)ammonium betain, Mn = 292

TABLE 3

| Components | Amount (parts) |
| --- | --- |
| Alkali-soluble acrylic resin 2 | 8.7 |
| Microgel[1] | 0.46 |
| Diazo resin 2 | 1.2 |
| Victoria Pure Blue BOH | 0.05 |
| Methoxypropanol | 69.75 |
| Isopropanol | 20 |

[1]Microgel having a particle size of 0.24 μm obtained by mixing polymer emulsifier/ethylene glycol dimethacrylate/methyl methacrylate/n-butyl acrylate in a ratio of 10/30/10/45 and subjecting the mixture to an emulsion polymerization According to the same manner as that described in Example 7 except that the resulting resin was used in place of the diazo resin 2, a photosensitive plate was obtained. The photosensitive wavelength region and sensitivity were measured according to the same manner as that described in Example 7. As a result, they were 219 to 591 nm and 23 mj/cm$^2$, respectively. For the printing plate obtained after developing, a similar durability test and printing test were conducted. As a result, the printing plate showed the same property as that of the printing plate of Example 7.

Then, the surface of the photosensitive plate was subjected to a cylindrical laser scanning (500 rpm, 400 lines/inch) while modulating a laser beam, which had been focussed into a beam diameter of 30 μm through an optical system from an air-cooled Argon laser (output of 5 W), by an optical modulator. The exposed plate was developed with an automatic developing device. As a result, good image was obtained.

COMPARATIVE EXAMPLE 4

According to the same manner as that described in Example 8 except that the diazo resin 7 was used in place of the diazo resin 2, a photosensitive plate was obtained. According to the same manner as that described in Example 8, the photosensitive plate was developed by laser exposure, but no image was obtained.

EXAMPLE 9

According to the same manner as that described in Example 8 except that the diazo resin 4 was used in place of the diazo resin 2, a photosensitive plate was obtained. The photosensitive wavelength region and sensitivity were measured according to the same manner as that described in Example 7. As a result, they were 219 to 591 nm and 23 mj/cm$^2$, respectively. For the printing plate obtained after developing, a similar durability test and printing test were conducted. As a result, the printing plate showed the same property as that of the printing plate of Example 7. According to the same manner as that described in Example 8, the photosensitive plate was developed by laser exposure. As a result, good image was obtained.

EXAMPLE 10

According to the same manner as that described in Example 8 except that the diazo resin 3 was used in place of the diazo resin 2, a photosensitive plate was obtained. The photosensitive wavelength region and sensitivity were measured according to the same manner as that described in Example 8. As a result, they were 219 to 591 nm and 23 mj/cm$^2$, respectively. For the printing plate obtained after developing, a similar durability test and printing test were conducted. As a result, the printing plate showed the same property as that of the printing plate of Example 7. According to the same manner as that described in Example 8, the photosensitive plate was developed by laser exposure. As a result, good image was obtained.

EXAMPLE 11

According to the same manner as that described in Example 8 except that the diazo resin 5 was used in place of the diazo resin 2, a photosensitive plate was obtained. The photosensitive wavelength region and sensitivity were measured according to the same manner as that described in Example 8. As a result, they were 219 to 591 nm and 23 mj/cm$^2$, respectively. For the printing plate obtained after developing, a similar durability test and printing test were conducted. As a result, the printing plate showed the same property as that of the printing plate of Example 7. According to the same manner as that described in Example 8, the photosensitive plate was developed by laser exposure. As a result, good image was obtained.

EXAMPLE 12

According to the same manner as that described in Example 8 except that the diazo resin 6 was used in place of the diazo resin 2, a photosensitive plate was obtained. The photosensitive wavelength region and sensitivity were measured according to the same manner as that described in Example 8. As a result, they were 219 to 591 nm and 23 mj/cm$^2$, respectively. For the printing plate obtained after developing, a similar durability test and printing test were conducted. As a result, the printing plate showed the same property as that of the printing plate of Example 7. According to the same manner as that described in Example 8, the photosensitive plate was developed by laser exposure. As a result, good image was obtained.

What is claimed is:

1. A photosensitive diazo resin-containing photosensitive resin composition for lithographic printing comprising a xanthene dye having an anion group in a molecule as a counter ion of a diazonium group.

2. The photosensitive resin composition for lithographic printing according to claim 1, wherein the xanthene dye is acidic.

3. The photosensitive resin composition for lithographic printing according to claim 1, wherein the xanthene dye is selected from the group consisting of Erythrosine, Eosine Y, Rose Bengal, Fluorescein, Uranine and Sulfo Rhodamine.

4. The photosensitive resin composition for lithographic printing according to claim 1 which further comprises a binding amount of a binder resin.

5. The photosensitive resin composition for lithographic printing according to claim 1 which further comprises a coloring amount of an image colorant.

* * * * *